United States Patent [19]
Inatomi et al.

[11] Patent Number: 5,514,918
[45] Date of Patent: May 7, 1996

[54] PULSE GENERATOR

[75] Inventors: Hiroshi Inatomi; Takashi Sakugawa; Hisashi Yanase; Takehisa Koganezawa; Kiyoshi Hara, all of Tokyo, Japan

[73] Assignee: Kabushiki Kaisha Meidensha, Tokyo, Japan

[21] Appl. No.: 133,247

[22] Filed: Oct. 8, 1993

[30] Foreign Application Priority Data

Oct. 9, 1992 [JP] Japan .................. 4-271253

[51] Int. Cl.$^6$ .................. H03H 11/00; H03K 3/00
[52] U.S. Cl. .................. 307/106; 327/100; 326/29; 333/20
[58] Field of Search .................. 307/104, 106, 307/108, 17; 327/100, 101, 103, 113, 124, 164, 165, 177, 181, 182, 183, 190, 268, 276, 277, 283, 290, 300, 301; 326/34, 29; 333/20; 331/107 R

[56] References Cited

U.S. PATENT DOCUMENTS

| 4,424,459 | 6/1982 | Inomata et al. | 307/415 |
|---|---|---|---|
| 4,612,455 | 9/1986 | Weiner et al. | 307/106 |
| 4,833,431 | 5/1989 | Bieniosek | 333/20 |
| 4,871,925 | 10/1989 | Yamauchi et al. | 306/107 |
| 5,072,191 | 12/1991 | Nakajima et al. | 328/65 |
| 5,138,193 | 8/1992 | Bruno et al. | 307/106 |
| 5,369,655 | 11/1994 | Miyamoto et al. | 372/29 |

FOREIGN PATENT DOCUMENTS

| 3835986 | 5/1989 | Germany . |
|---|---|---|
| 4010366 | 10/1990 | Germany . |
| 4029989 | 3/1992 | Germany . |
| 4030184 | 3/1992 | Germany . |

Primary Examiner—William M. Shoop, Jr.
Assistant Examiner—Peter Ganjoo
Attorney, Agent, or Firm—Foley & Lardner

[57] ABSTRACT

A pulse generator is composed of switch means to switch supply of a first current through a circuit, a first condenser connected to the switch means in series and primary charged by the first current, voltage raising means having a primary winding serially connected to the first condenser and a secondary winding to obtain voltage output by the first current, magnetic switch means of current flow switchable having a primary winding serially connected to the secondary winding of the voltage raising means and a secondary winding, a second condenser connected to the secondary winding of the magnetic switch means and charged by the output therefrom, and discharging means connected to the second condenser to generate pulse discharge when charged voltage of the second condenser is applied thereto by switching the magnetic switch means.

14 Claims, 5 Drawing Sheets

5,514,918

PULSE GENERATOR

BACKGROUND OF THE INVENTION

1. Field of the Invention

The present invention relates generally to a pulse generator generating a short pulse having high voltage and a large amount of current. Specifically, the present invention relates to such a pulse generator including a semiconductor switch and a saturable transformer.

2. Description of the Background Art

Generally, apparatus for pulse laser excitation, pulse plasma generation or pulse denitration, is well known as a pulse generator. In order to obtain a desired pulse, discharging switches are used, such as thyratron and trigatron switches, to directly switch high voltage and a large amount of current. A combination of a semiconductor switch and a saturable reactor which functions as a magnetic switch is also utilized.

Additionally, one saturable transformer for raising voltage concurrently with pulse compressing to reduce the load of a switching device is also utilized for pulse generation.

FIG. 5 illustrates a conventional circuit including a saturable reactor. A wave form generated from the circuit is also illustrated in the figure. A plurality of thyristors TH, which function as a semiconductor switch at high voltage, are connected in series. A condenser $C_{11}$ connected to the circuit is charged by high voltage. A reactor L is located at the upstream of the condenser $C_{11}$. A first current $I_1$ is generated by a short-circuit from the series circuit including the condenser $C_{11}$ and the reactor L. Polarity of the condenser $C_{11}$ is inverted thereby to generate voltage twice as that obtained from LC inversion via the series connection of condensers $C_{11}$ and $C_{12}$. A second current $I_2$ of pulse compressed is generated by this high voltage, at a circuit including a saturable reactor $SR_1$, condensers $C_{11}$, $C_{12}$ and $C_2$ which are connected in series. Then, A third current $I_3$ of pulse compressed is generated by the voltage of the condenser $C_2$, at a circuit including a saturable reactor $SR_2$, condensers $C_3$ and $C_2$ which are connected in series. Finally, a compressed pulse $I_4$ having large amount of current and high voltage is generated at the circuit including a saturable reactor $SR_3$ and a discharge tube DT.

However, in the conventional pulse generator including discharging switch devices, the lifetime of the switch devices is very short, i.e., $10^7$ to $10^8$ pulse. Therefore, when the circuit is operated repeatedly, duration of the switch devices is limited.

Furthermore, in the conventional pulse generator including the combination of the semiconductor switch and the saturable reactor, the withstand voltage of the switch devices is smaller than that of the discharging switch device. Therefore, a plurality of semiconductor switches must be connected in series in order to generate high voltage. This causes the switch circuit to be enlarged because a drive circuit and a snubber circuit are added to each switch device corresponding to the number of series connection. In addition, voltage shared by respective switch becomes unequal if switches timing is upset. On the other hand, the switches may be connected in parallel, however, excess current flows through the switch if switch timing is upset or any one of switches is failed. This causes other switches to be failed.

Utilizing a pulse transformer for voltage raising to reduce the number of the switch device, and reducing the switching voltage to about ½ of that of output voltage by a LC inversion circuit are both available, however, the number of the switch device and the number of magnetic pulse compressed are not minimized. This enlarges the circuit compared with that including the discharging switch.

Minimization of the circuit may be done by utilizing single saturable transformer to unite function of voltage raising and magnetic pulse compression. However, the number of turns of the secondary winding of the saturable transformer becomes larger to raise the voltage raising ratio because one transformer unites two functions. This increases inductance causing LC resonance time during pulse compression to be lengthened. Thus, generation of a short pulse is limited. On the other hand, the turns ratio of the winding must be reduced to decrease inductance at the secondary area of the saturable transformer. This causes voltage raising ratio to be reduced and load on the switch device to be increased.

SUMMARY OF THE INVENTION

It is therefore a principal object of the present invention to provide a pulse generator which can generate a pulse having high voltage and a large amount of current.

It is another object of the present invention to provide a pulse generator including a semiconductor switch device of which control voltage is reduced.

It is a further object of the present invention to minimize a size of such a pulse generator.

In order to accomplish the aforementioned and other objects, a pulse generator is composed of switch means to switch supply of a first current through a circuit, a first condenser connected to the switch means in series and primarily charged by the first current, voltage raising means having a primary winding serially connected to the first condenser and a secondary winding to obtain voltage output by the first current, magnetic switch means of switchable current flow having a primary winding serially connected to the secondary winding of the voltage raising means and a secondary winding, a second condenser connected to the secondary winding of the magnetic switch means and charged by the output therefrom, and discharging means connected to the second condenser to generate pulse discharge when charged voltage of the second condenser is applied thereto by switching the magnetic switch means.

The switch means can be formed of a series or a parallel connection of plurality of semiconductor switches.

When the switch means is formed of the series connection, the voltage raising means can be formed of a voltage raising transformer. On the other hand, when the switch means is formed of the parallel connection, the voltage raising transformer can be formed of plurality of pulse transformers or saturable transformers corresponding to each connection of the semiconductor switches. The primary and secondary windings of the voltage raising means may be wound at a turns ratio such that high voltage raising ratio is obtainable, wherein the voltage raising means is a voltage raising transformer.

The magnetic switch means can be a saturable transformer having a core which is saturable when the second condenser is completely charged. The number of turns of the secondary winding of the magnetic switch means is reduced to reduce voltage raising ratio thereat.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENT

Figure 1:
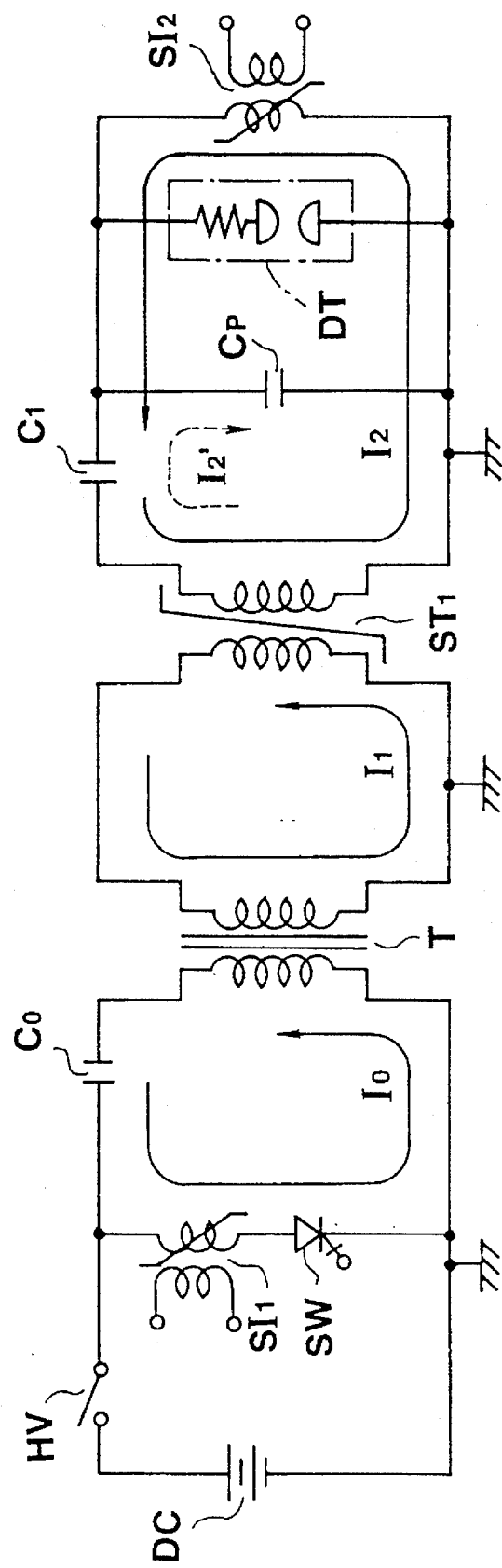
FIG. 1 is a schematic diagram illustrating a circuit of a first embodiment according to the present invention.

Referring to FIG. 1, showing a schematic diagram of a first embodiment according to the present invention, a semiconductor switch SW is arranged as an initial step switch including a semiconductor switch device, such as a GTO thyristor, a SI thyristor and a IGBT, and a gate control circuit and a snubber circuit of the switch device. A first saturable reactor $SI_1$, a first condenser $C_0$ and a primary winding of a voltage raising transformer T for raising voltage of a circuit, are connected in series. The circuit is connected to the semiconductor switch SW in series. A primary winding of a saturable transformer $ST_1$ is connected in series to a secondary winding of the voltage raising transformer T, then a secondary winding of the saturable transformer $ST_1$ is parallelly connected to a series circuit between a second condenser $C_1$ and a condenser $C_p$. A discharge tube DT and a second saturable reactor $SI_2$ are respectively parallelly connected to the condenser $C_p$.

The first and second saturable reactors $SI_1$ and $SI_2$ include magnetic cores having large effective magnetic flux density ($\Delta$ B), e.g., a magnetic core formed of ferro-amorphous alloy, ferro-ultramicrocrystal alloy, or cobalt amorphous alloy. The first reactor $SI_1$ functions as a magnetic assistant to assist operation of the semiconductor switch SW, on the other hand, the second reactor $SI_2$ functions as means for decreasing pre-pulse generation by bypassing current charged at the second condenser $C_1$ through the discharge tube DT. Thus, discharge of the condenser $C_1$ is blocked to prevent generation of pre-pulse at the discharge tube DT. The second reactor $SI_2$ also supplies current toward the discharge tube DT by blocking discharging current from the condenser $C_1$. The second saturable reactor $SI_2$ can be substituted by an air-core.

The first saturable transformer $ST_1$ includes a magnetic core having high rectangular ratio, e.g., a magnetic core formed of ferro-amorphous alloy, ferro-ultramicrocrystal alloy or cobalt amorphous alloy. The primary winding and the secondary winding of the transformer $ST_1$ are wound such that the winding ratio is regulated to slightly raise voltage or to decrease voltage. For example, the winding ratio of the transformer $ST_1$ is prefer to be determined at 1:2.

The condensers $C_0$, $C_1$ and $C_p$ can be formed of materials having low inductance and high voltage resistance to generate a short pulse of high voltage. A ceramic condenser or an oil condenser is prefer red to use.

The secondary winding of the voltage raising transformer T is regulated to have larger number of turns than that a of the primary winding thereof such that high voltage raising ratio can be obtained.

The aforementioned embodiment operates as follows.

The first condenser $C_0$ is charged at the high voltage by D.C. power source DC. Then, the semiconductor switch SW switches current ON to supply the primary current $I_0$ from the condenser $C_0$ toward the primary winding of the voltage raising transformer T via the first saturable reactor $SI_1$ and the semiconductor switch SW.

According to current flow of $I_0$, the voltage raising transformer T transforms voltage raised corresponding to the turns ratio, e.g., 1:6, toward the secondary winding thereof. The saturable reactor $SI_1$ functions as a magnetic assistant of the semiconductor switch SW to reduce the switching loss of the switch SW. Thus, the switch SW can be used at current peak higher than that of switching done without the magnetic assistant.

Current $I_1$ flows at the secondary area of the voltage raising transformer T from the secondary winding thereof toward the first winding of the saturable transformer $ST_1$. According to current flow of $I_1$, the saturable transformer $ST_1$ is operated in non-saturation area. The raised voltage corresponding to the turns ratio of the winding is obtained at the secondary winding of the saturable transformer $ST_1$. The condenser $C_1$ is charged by current $I_2$ in the non-saturation area. During charging, the saturable reactor $SI_2$ is magnetized in the direction of the current $I_2$, which is easily flowable. The saturable transformer $ST_1$ is designed such that the core thereof is saturated when flow of current $I_2$ is ended. Thus, when flow of current $I_2$ is ended, the saturable transformer $ST_1$ is operated in the saturation area. Then, the primary area and the secondary area of the transformer $ST_1$ are unconnected. Electric charge charged at the condenser $C_1$ is saturated by the saturable transformer $ST_1$, therefore, reversed current $I_2'$ flows, then electric charge transforms to the condenser $C_p$. Thus, voltage at the discharge tube DT reaches to the level of generation. The saturable transformer $ST_1$ does not function as the transformer but as the magnetic switch, i.e., the saturable reactor, to supply current $I_2'$ of pulse compressed from the condenser $C_1$ toward the secondary winding of the transformer $ST_1$. Short-circuit current is supplied to the discharge tube DT by this current $I_2'$, i.e., short pulse having high voltage and large amount of current is supplied to the tube DT.

According to the aforementioned embodiment, the voltage raising transformer T and the saturable transformer $ST_1$ form a cascade connection. Thus, the voltage raising transformer T exclusively operates as a voltage raising device to raise voltage raising ratio, therefore, desired raised voltage can be obtained. The saturable transformer $ST_1$ decreases the voltage raising ratio and number of turns of the secondary winding thereof to reduce inductance after saturation. Therefore, the saturable transformer $ST_1$ exclusively operates as a pulse compressor to raise compressing ratio of pulse length.

Therefore, the semiconductor switch SW can be operated at the lower voltage. Furthermore, high voltage and pulse compressed current can be provided to the loaded area.

Figure 2:
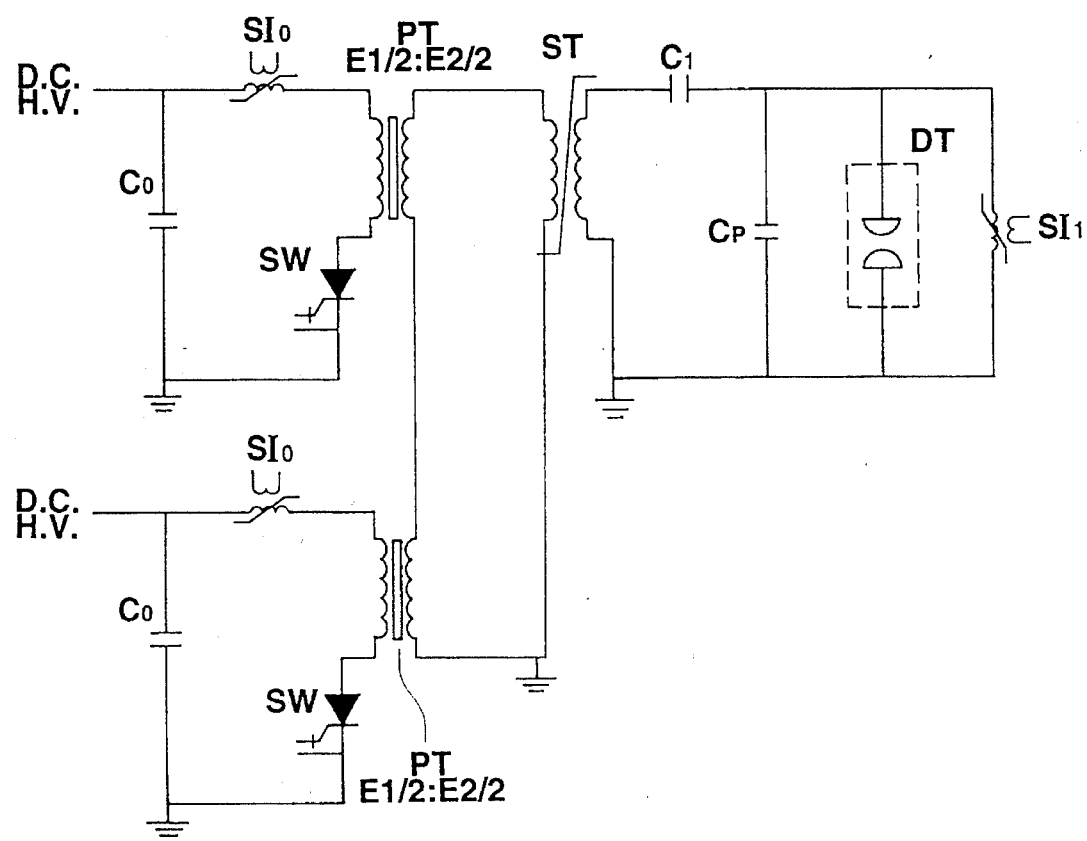
FIG. 2 is a schematic diagram illustrating a circuit of a second embodiment according to the present invention.

Referring now to FIG. 2, showing a second embodiment of the present invention, the same character illustrates the same component as the first embodiment. A plurality of semiconductor switches SW are connected in parallel, wherein each circuit respectively has a condenser $C_0$ and a saturable reactor $SI_0$ via a pulse transformer PT having a turns ratio of E1/2:E2/2. The switch can be substituted by GTO. The condensers $C_0$ are charged and the pulse transformers PT raise pulse voltage of the condensers $C_0$. The secondary area of pulse transformers are connected in series. A saturable transformer ST, which raises and compresses voltage obtained from the series connection, is connected to the circuit at the downstream of the pulse transformers PT. A second condenser $C_1$ is connected to the circuit at the downstream of the saturable transformer ST to charge voltage generated at the secondary area of the transformer ST.

When operated, the switches transform electric charge charged at the first condensers $C_0$ to the second condenser $C_1$ to supply high voltage pulse to the loaded area connected to the secondary area of the saturable transformer ST. The saturable transformer ST is designed such that the core thereof can be saturated when charging the second condenser $C_1$ is finished.

Generally, generation of excess voltage and current is caused by timing upset of the semiconductor switches parallelly connected. According to the second embodiment, such problems can be avoided by location of respective pulse transformer against corresponding semiconductor switch. Furthermore, because the circuit is connected in series at the secondary area of the saturable transformer ST, a pulse having high voltage and a large amount of current can be generated from the circuit.

Figure 3:
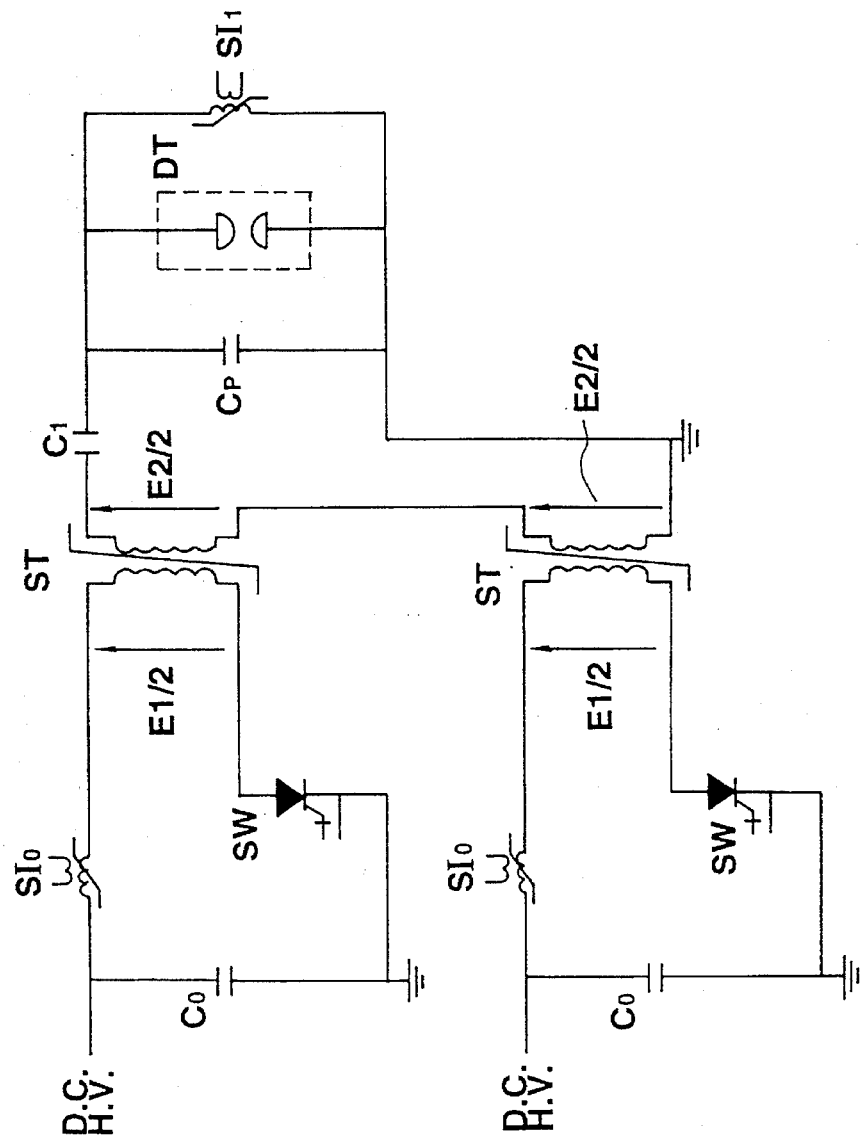
FIG. 3 is a schematic diagram illustrating a circuit of a third embodiment according to the present invention.

Referring now to FIG. 3, showing a third embodiment of the present invention, the same character illustrates the same component as the first embodiment. A plurality of semiconductor switches SW are connected in parallel via respective saturable transformer ST having a turns ratio of E1/2:E2/2. Each circuit includes a first condenser $C_0$ and a saturable reactor $SI_0$. The switch SW can be substituted by GTO. The condensers $C_0$ are charged and the saturable transformers ST raise or compress pulse voltage of the condensers $C_0$. The secondary area of saturable transformers ST are connected in series. A second condenser $C_1$ is connected to the circuit at the downstream of the saturable transformers ST to charge voltage generated at the secondary area of the transformer ST.

When operated, the switches transform electric charge charged at the first condensers $C_0$ to the second condenser $C_1$ to supply a high voltage pulse to the loaded area connected to the secondary area of the saturable transformer ST. The saturable transformers ST are designed such that the cores thereof can be saturated when charging the second condenser $C_1$ is finished.

According to the third embodiment, problems caused by switch timing upset can be avoided by location of respective saturable transformer against corresponding semiconductor switch. Furthermore, because the circuit is connected in series at the secondary area of the saturable transformer ST, pulse a having high voltage and a large amount of current can be generated from the circuit.

Figure 4:
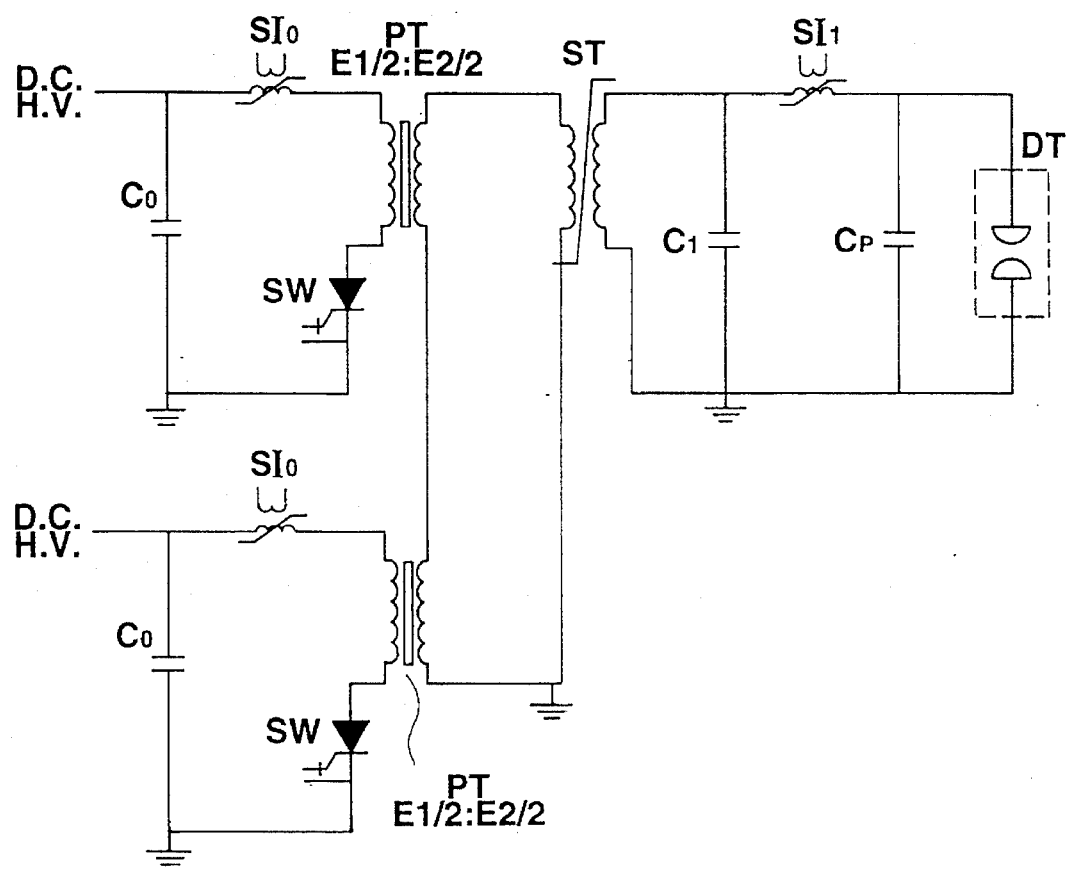
FIG. 4 is a schematic diagram illustrating a circuit of a fourth embodiment according to the present invention.
Figure 5:
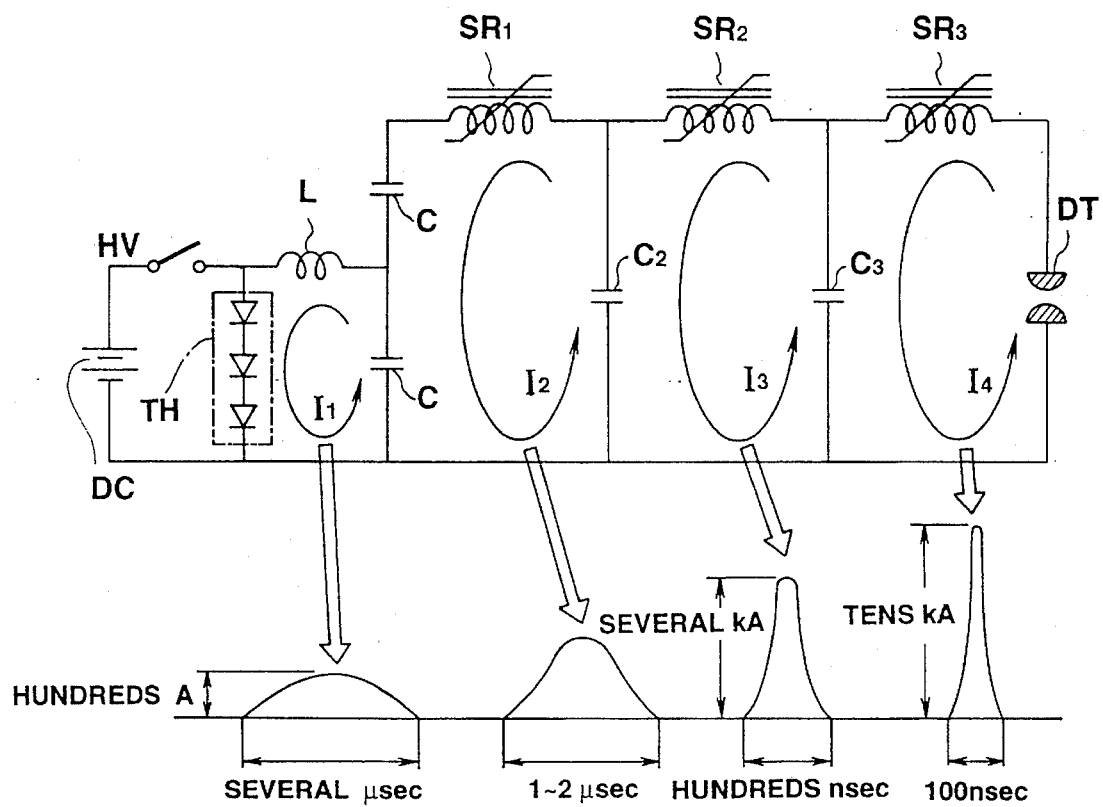
FIG. 5 is a schematic diagram illustrating a circuit and a wave form generated therefrom according to prior art.

Referring now to FIG. 4, showing a fourth embodiment of the present invention, the same character illustrates the same component as the first embodiment. A plurality of semiconductor switches SW are connected in parallel via respective pulse transformer PT having a turns ratio of E1/2:E2/2. Each circuit includes a first condenser $C_0$ and a saturable reactor $SI_0$. The switch SW can be substituted by GTO. The condensers $C_0$ are charged and the pulse transformers ST raise pulse voltage of the condensers $C_0$. The secondary area of pulse transformers PT are connected in series. A saturable transformer ST, which raises or compresses voltage obtained from the series connection, is connected to the circuit at the downstream of the pulse transformers PT. A second condenser $C_1$ is parallelly connected to the circuit at the downstream of the saturable transformer ST to charge voltage generated at the secondary area of the transformer ST.

When operated, the switches transform electric charge charged at the first condensers $C_0$ to the second condenser C1 to supply a high voltage pulse to the loaded area connected to the secondary area of the saturable transformer ST. The saturable transformer ST is designed such that the core thereof can be saturated when charging the second condenser $C_1$ is finished.

According to the fourth embodiment, problems caused by switch timing upset can be avoided by location of respective pulse transformer against corresponding semiconductor switch. Furthermore, because the circuit is connected in series at the secondary area of the saturable transformer ST, a pulse having high voltage and a large amount of current can be generated from the circuit.

According to the present invention, pulse voltage generated by the semiconductor switch SW and the first condenser $C_0$ can be raised by location of the voltage raising transformer T or the pulse transformer PT or the saturable transformer ST. The raised voltage is compressed by the saturable transformer ST having smaller number of turns of secondary winding to obtain a short pulse. Therefore, control voltage of the primary step switch can be decreased by the raised voltage of the transformer. Then voltage load on the semiconductor switch can also be reduced. Therefore, connection steps of the semiconductor switch devices can be minimized. Thus, the switch circuit and the adjacent circuit thereof can be simplified and minimized.

Additionally, the pulse voltage raised by the transformer is compressed by the saturable transformer. Therefore, the voltage raising ratio of the saturable transformer and the number of turns of the secondary winding can be minimized. Thus, the core volume of the saturable transformer can be reduced to allow minimization of the saturable transformer.

While the present invention has been disclosed in terms of the preferred embodiment in order to facilitate better understanding of the invention, it should be appreciated that the invention can be embodied in various ways without depending from the principle of the invention. Therefore, the invention should be understood to include all possible embodiments and modification to the shown embodiments which can be embodied without departing from the principle of the inventions as set forth in the appended claims.

What is claimed is:

1. A pulse generator comprising:

switch means for switching a supply of a first current through a circuit, a first condenser serially connected to said switch means and charged by said first current, voltage raising means for obtaining a voltage output by said first current, said voltage raising means having a primary winding and a secondary winding, said primary winding being serially connected to said first condenser, magnetic switch means for switching current flow, said magnetic switching means having a primary winding and a secondary winding, said primary winding being serially connected to said secondary winding of said voltage raising means, a second condenser connected to said secondary winding of said magnetic switch means and charged by an output therefrom, and discharging means for generating a pulse discharge, said discharging means being connected to said second condenser to generate a pulse discharge when a charged voltage of said second condenser is applied thereto by switching said magnetic switch means.

2. A pulse generator as set forth in claim 1, wherein said switch means is formed of a plurality of semiconductor switches connected serially.

3. A pulse generator as set forth in claim 1, wherein said switch means is formed of a plurality of semiconductor switches connected in parallel.

4. A pulse generator as set forth in claim 1, wherein said primary and secondary windings of said voltage raising means are wound at a turns ratio such that a high voltage raising ratio is obtainable.

5. A pulse generator as set forth in claim 2, wherein said voltage raising means is a voltage raising transformer.

6. A pulse generator as set forth in claim 3, wherein said voltage raising means includes a plurality of pulse transformers corresponding to each connection of said semiconductor switches.

7. A pulse generator as set forth in claim 3, wherein said voltage raising means includes a plurality of saturable transformers corresponding to each connection of said semiconductor switches.

8. A pulse generator as set forth in claim 1, wherein said magnetic switch means is a saturable transformer.

9. A pulse generator as set forth in claim 1, wherein said magnetic switch means further includes a core which is saturable when said second condenser is completely charged.

10. A pulse generator as set forth in claim 1, wherein a number of turns of said secondary winding of the magnetic switch means is reduced to reduce voltage raising ratio thereat.

11. A pulse generator as recited in claim 1, wherein said switch means comprises:

a magnetic assistant circuit; and a semiconductor switch coupled serially with said magnetic assistant circuit.

12. A pulse generator as recited in claim 11, wherein said magnetic assistant circuit comprises a saturable reactor.

13. A pulse generator, comprising:

a) semiconductor switching means, having at least one semiconductor switching device, for operatively turning on a first current;

b) first charging means connected to said semiconductor switching means and into which the first current is supplied;

c) a voltage boosting transformer having a primary winding connected to said first charging means and a secondary winding across which a boosted voltage is generated, wherein a boosted voltage value is determined according to a winding ratio of said voltage boosting transformer and according to a value of the first current;

d) magnetic switch means having a saturable transformer, said saturable transformer having a primary winding and a secondary winding thereof, said primary winding of said magnetic switch means being connected to the secondary winding of said voltage boosting transformer;

e) second charging means connected to the secondary winding of said magnetic switch means for charging a voltage across the secondary winding of said magnetic switch means; and f) discharging means connected to said second charging means for generating a pulse discharge thereacross when the charged voltage in said second charging means is applied thereto according to a magnetic switching action of said magnetic switch means.

14. A pulse generator, comprising:

a first switch circuit to switch the supply of a first current through a circuit;

a first charging circuit coupled to said first switch circuit and charged by said first current;

a voltage boosting circuit coupled to said first charging circuit to provide a boosted voltage;

a reversible switch circuit couled to said voltage boosting circuit to supply a second current flowing in a first direction and having a switching action to allow a third current to flow in a second direction opposite to said first direction;

a second charging circuit coupled to said reversible switch circuit and charged by said second current to supply said third current upon said switching action of said reversible switch circuit; and a discharge circuit coupled to said second charging circuit and charged by said third current to generate a pulse discharge across said discharge circuit.

* * * * *